United States Patent
Hsiao et al.

(10) Patent No.: US 6,522,201 B1
(45) Date of Patent: Feb. 18, 2003

(54) RF AMPLIFIER HAVING SWITCHED LOAD IMPEDANCE FOR BACK-OFF POWER EFFICIENCY

(75) Inventors: Shuo-Yuan Hsiao, Milpitas, CA (US); Wei-Shu Zhou, Fremont, CA (US); Nanlei Y Larry Wang, Palo Alto, CA (US)

(73) Assignee: EiC Corporation, Fremont, CA (US)

( * ) Notice: Subject to any disclaimer, the term of this patent is extended or adjusted under 35 U.S.C. 154(b) by 0 days.

(21) Appl. No.: 09/672,384

(22) Filed: Sep. 28, 2000

(51) Int. Cl.$^7$ .............................. H03G 3/10; H03G 3/30
(52) U.S. Cl. .................. 330/278; 330/124 R; 330/29.5; 330/284; 330/302
(58) Field of Search ..................... 330/124 R, 295, 330/278, 284, 302

(56) References Cited

U.S. PATENT DOCUMENTS 3,449,685 A * 6/1969 Holmes ........................ 330/295
5,307,512 A * 4/1994 Mitzlaff ........................ 330/284
5,565,823 A * 10/1996 Fratti ........................... 333/81 R

OTHER PUBLICATIONS

Holt "Electronic Circuits Digital and Analog" 1978, by John Wiley & Sons, Inc. pp 384 and 545.*
McMorrow, Robert J. et al., "The Microwave Doherty Amplifier," 1994 IEEE MTT–S Digest, pp. 1653–1656, 1994.
Upton, David M. et al., "A New Circuit Topology to Realize High Efficiency, High Linearity, and High Power Microwave Amplifiers," RAWCON'98 Proceedings, pp. 317–320, 1998.
Youngoo Yang et al., "Experimental Investigation on Efficiency and Linearity of Microwave Doherty Amplifier," 2001 IEEE MTT–S Digest Phoenix, AZ, 4 pp, 2001.
Iwamoto, Masaya et al., "An Extended Doherty Amplifier with High Efficiency Over a Wide Power Range," 2001 IEEE MTT–S Digest Phoenix, AZ, 4 pp., 2001.

* cited by examiner

Primary Examiner—Michael B Shingleton
(74) Attorney, Agent, or Firm—Townsend and Townsend and Crew LLP; Henry K. Woodward

(57) ABSTRACT

Efficiency of an RF/microwave power amplifier is increased at a back-off power level by increasing the load resistance of the amplifier at the reduced output power level as compared to load impedance at a higher power level including full operating power. The different load impedances can be realized with two amplification units in parallel each having different load impedances. Alternatively, a single amplification path can be provided with an output impedance matching network which is selectively bypassed for increased impedance load during back-off power operation. In another embodiment, the output impedance matching network can include a shunt inductance which is selectively switched into the network to increase impedance for back-off power operation.

9 Claims, 3 Drawing Sheets

RF AMPLIFIER HAVING SWITCHED LOAD IMPEDANCE FOR BACK-OFF POWER EFFICIENCY

BACKGROUND OF THE INVENTION

This invention relates generally to RF amplifiers operable at full power and at a lower back-off power, and more particularly the invention relates to improving the amplifier efficiency at a back-off power level.

FIG. 1 is a schematic of an RF/microwave amplifier including a bipolar transistor 2 having a grounded emitter, a DC biased RF input connected to the base, a power terminal (+V) connected through inductor 4 to the collector, and an output coupled to the collector through capacitor 6.

An RF and microwave amplifier can achieve high efficiency at full output power. However, in many wireless communication applications such as CDMA, the amplifier is operated at a back-off power level much more frequently than at full power level. Unfortunately, at back-off power level the efficiency of an amplifier usually suffers. The efficiency degrades as a result of not fully using the available voltage and current, as illustrated in the current versus voltage plot of FIG. 2 for a RF power amplifier operating at various input levels. Line 10 (solid) is the load line for the class A RF amplifier operating at full voltage, while line 12 (wavy) is the load line for the amplifier operating at a back-off power level. Changing from class A bias to class B bias helps the efficiency as shown by load line 14 (wavy), but efficiency at the back-off power level is still poor.

One method for achieving a higher efficiency at a back-off power level is to change the bias voltage with power level as shown in the plot of FIG. 3. At the back-off voltage as well as at full power, neither voltage nor current utilization is wasted. However, at the back-off voltage, the knee of the characteristic current/voltage curves degrades the amplifier efficiency.

The present invention is directed to improving the operating efficiency of an RF/microwave amplifier when operating at a back-off power level.

SUMMARY OF THE INVENTION

In accordance with the invention, efficiency of a power amplifier is increased at a back-off power level by increasing the load impedance of the amplifier at the reduced output power level as compared to load impedance at a higher power level including full output power.

In a preferred embodiment, an RF/microwave amplifier which is operable at two or more output power levels comprises a first signal amplification unit having an input terminal for receiving an input signal, an output terminal for producing an amplified output signal, and a power terminal for receiving electrical power. A load is coupled to the output terminal and has a first impedance value for a full power output and a second impedance value for a back-off power level, the second value being greater than the first value. The signal amplification unit may comprise at least one transistor such as a bipolar transistor or a field effect transistor.

In one embodiment of the invention the RF amplifier includes a second signal amplification unit in parallel with the first signal amplification unit with a second load coupling the output terminal of the second signal amplification unit to the RF output, the second load having a higher impedance than the first load, and a switch means for alternately connecting the first signal amplification unit and the second signal amplification unit to the RF output.

The invention and objects and features thereof have been made more readily apparent from the following detailed description and appended claims when taken with the drawings.

DETAILED DESCRIPTION OF ILLUSTRATED EMBODIMENTS

In accordance with the invention, efficiency of a power amplifier is increased at a back-off power level by increasing the load impedance of the amplifier at the reduced output power level as compared to load impedance at a higher power level including full output power.

Figure 1:
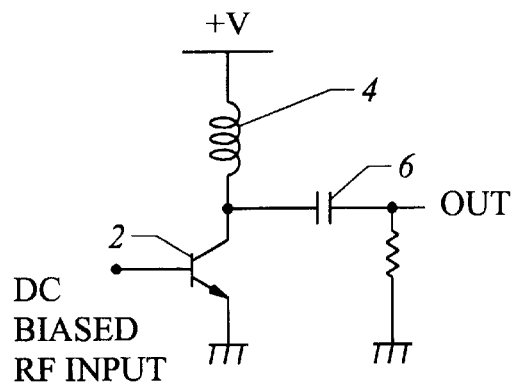
FIG. 1 is a schematic of a transistor amplifier stage for an RF/microwave amplifier.
Figure 2:
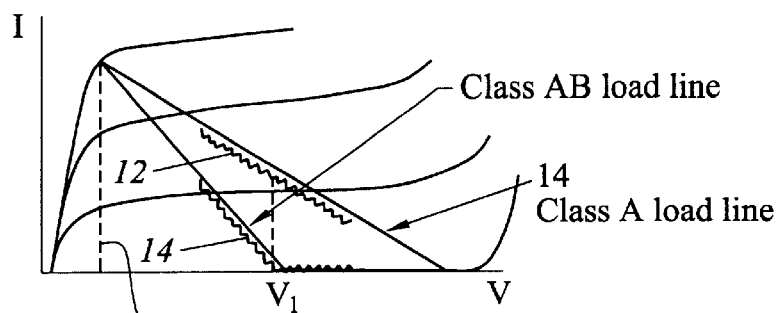
FIG. 2 is a plot of current versus voltage for two power levels of the amplifier of FIG. 1.
Figure 3:
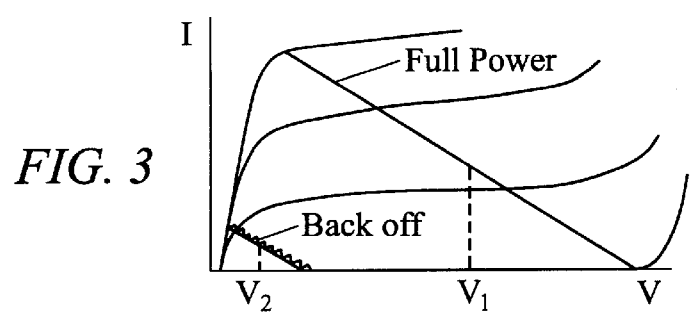
FIG. 3 is a plot of current versus voltage for a plurality of dc bias levels showing load lines for full-power output and a back-off power level in which dc bias level is reduced for the output power level.
Figure 4:
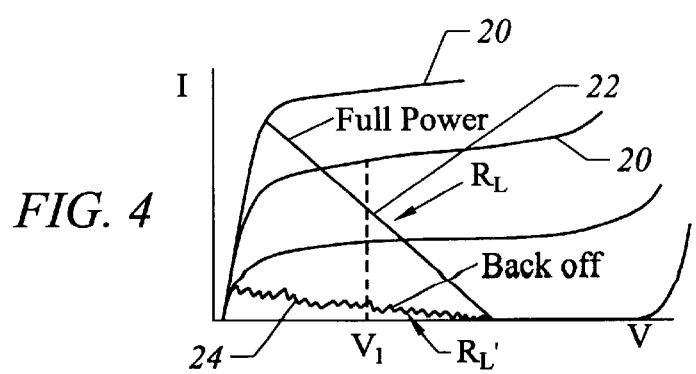
FIG. 4 is a plot of current versus voltage for a plurality of input RF levels for full-power output and for a reduced power output in which load impedance is increased for the reduced power output in accordance with the invention while maintaining the same dc bias voltage.

This is illustrated in FIG. 4 which is a plot of operating current versus voltage for a plurality of input bias voltages as illustrated at 20. The full power load line is illustrated at 22 and the back-off, or reduced power level load line, is illustrated at 24. The dc bias level is kept constant at $V_1$, but the load line is changed by increasing the load impedance for the back-off power level. Therefore, the knee voltage effect is the same with load line change. Only the current utilization is optimized as the voltage utilization remains the same.

To change the load impedance continuously over many levels and maintain a low-loss output matching circuit would be difficult. Accordingly, in accordance with the invention, the load impedance is only switched at a limited number of back-off power levels to achieve a good trade-off. In the example of a power amplifier for IS95 CDMA standard, the full output power is about 28 dBm, and a back-off power level is 16 dBm which accounts for more than 90% probability in usage. By switching the load impedance, the efficiency at 16 dBm, can be raised to 20–30% or more from the 6–10% range with no switching of load impedance.

Figure 5:
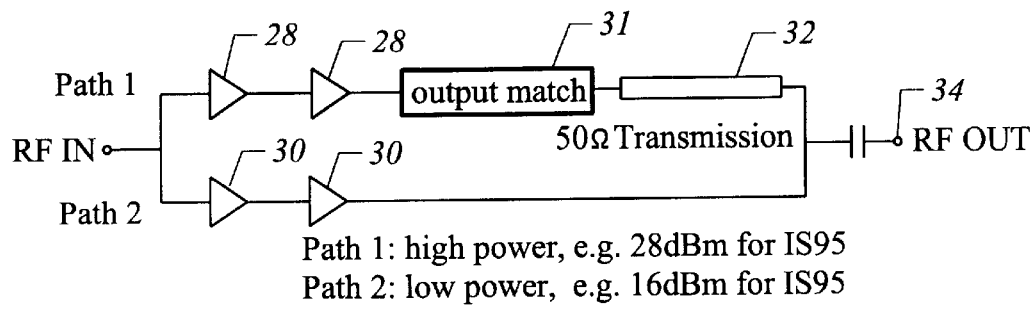
FIG. 5 is a schematic of first and second signal amplification units which selectively apply an amplified input signal to an RF output in accordance with one embodiment of the invention.

FIG. 5 is a schematic illustrating one method of implementing a load impedance change by switching between two amplifiers. For output power between 16 dBm and 28 dBm, path 1 is utilized which includes two amplifier stages 28 with an output matching network 31 and a 50 ohm transmission line 32, which connect to RF output 34 with a load impedance of 50 ohms. Path 2, including transistor stages 30, is turned off when path 1 is activated. For less than 16 dBm output power, path 2 is utilized by turning off transistor stages 28 and activating transistor stages 30. Path 2 does not include an output matching stage or 50 ohm transmission line and thus the output impedance is at a higher level than is the output impedance for path 1 utilizing an output matching network. Both paths can have a similar amount of gain, which can minimize the driving gain change adjustment, or the gain of one path can be different and thereby add some gain variation if desired.

Since path 2 will deliver 16 dBm, the circuit can be simple and transistor-size small, thereby having a minimal impact on the circuit size. At the off state, the output impedance of path 2 is high compared to 50 ohms, and it has minimum loading on the path 1 operation. Conversely, when path 1 is turned off, the reflection coefficient is near 1 in amplitude, and the section of 50 ohm transmission line adjusts the output impedance of path 1 to a high level so that it will have negligible loading on path 2 operation.

Figure 6:
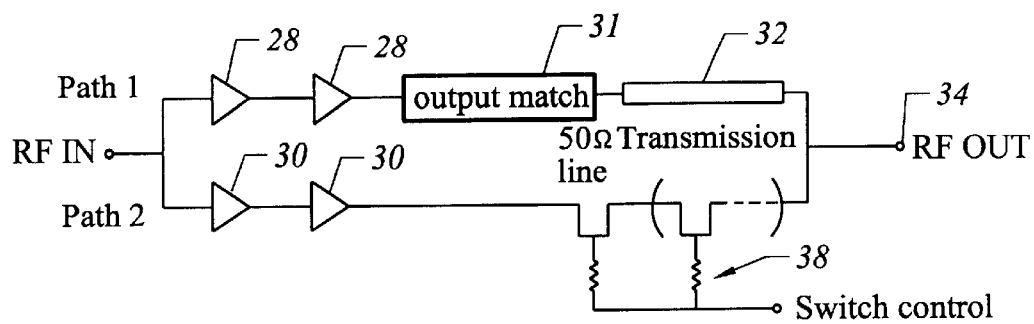
FIG. 6 is a schematic of the RF amplifier of FIG. 5 including switch control for removing one signal amplification unit.

A drawback of the approach in FIG. 5 is the very high voltage swing on load 34 when high power path 1 is working and low power path 2 is turned off. Since amplifier 30 is connected directly to output 34, the high voltage swing is applied to amplifier 30 also. This can result in amplifier 30 conducting current, even though amplifier 30 is turned off, which adversely affects overall efficiency. To further improve the performance of the circuit of FIG. 5, a microwave/RF switch 38 can be inserted at the output of path 2 as shown in FIG. 6. Switch 38 increases the isolation of path 2 in the off state when path 1 is in operation. When path 2 is operating, the switch is turned on. Since only 16 dBm signal is handled, a small switch comprising FET transistors can be used which saves in cost.

Figure 7:
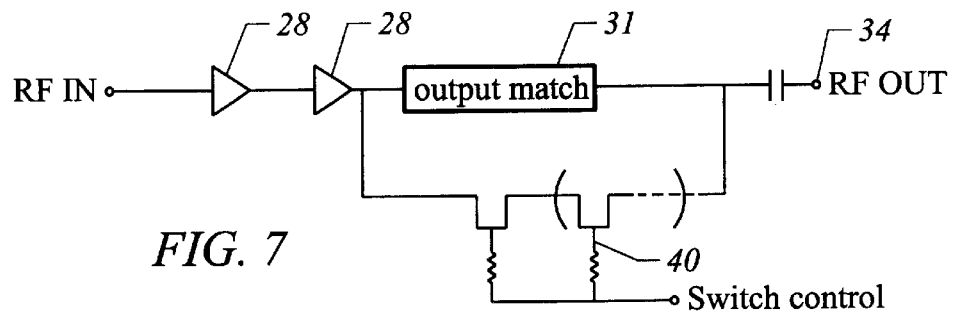
FIG. 7 is a schematic of another signal amplification unit in which an output matching network is selectively removed from the unit for reduced power.

To further simplify the amplifier circuit, either path 1 in FIG. 5 or a single path can be utilized with the output matching circuit selectively switched in and out of the circuit as shown in FIG. 7. Here, an FET switch 40 is added between output transistors 28 and the final 50 ohm output load. For 16–28 dBm output power operation, the switch is turned off and output matching network 31 is introduced into the circuit. The switch has negligible effect on the low-loss matching network. For below 16 dBm operation, the switch is turned on thereby shorting out the output matching circuit and connecting the power transistors 28 directly to the load impedance, which increases load impedance. Again, since the switch passes only 16 dBm power to the 50 ohm load, the switch size can be small. However, as in FIG. 6, the switch needs to sustain a large voltage swing at 28 dBm output power. Accordingly, if a single transistor switch does not have a sufficiently high operating voltage, two or more transistor switches can be connected in series as illustrated.

Figure 8:
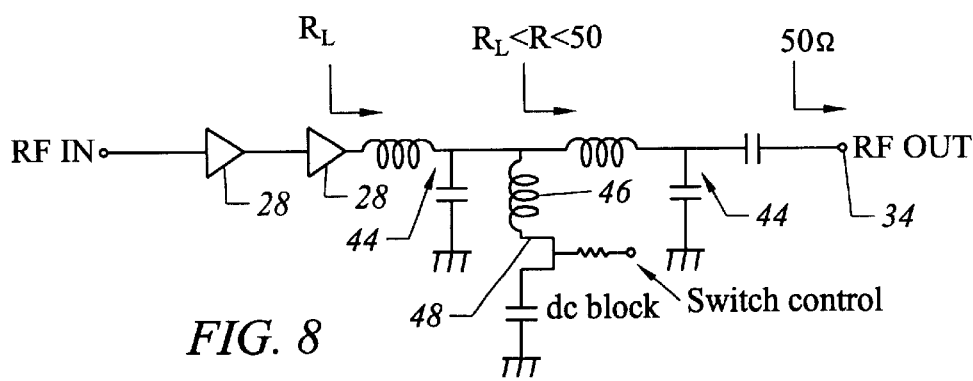
FIG. 8 is a schematic of another embodiment of a signal amplification unit in accordance with the invention.

To reduce the voltage swing on top of the switch, the output matching circuit can be modified as shown in FIG. 8. The amplifier stages 28 are connected through output LC networks 44 to a 50 ohm RF output 34. An extra shunt inductance 46 connected to circuit ground by FET switch 48 and capacitor 49 is added to the output matching circuit. Inductor 46 is included at an impedance level lower than 50 ohms, and the voltage swing is thus lower at this point. For full power operation, switch 48 is turned off and the shunt inductor is not loading the original matching circuit. At the lower power level with the switch turned on, the load impedance to the power amplifier is changed to 50 ohms. Thus with switch 48 turned off, the load impedance, $R_L$, of the power amplifier stages 28 is lower than 50 ohms for high power operation. When switch 48 is turned on, the inductor 46 is connected and the load impedance becomes higher for the low-power operation. Since inductor 46 and switch 48 are connected at a lower impedance level than 50 ohms, the RF voltage swing is lower and the requirements for switch 48 is reduced.

Figure 9A:
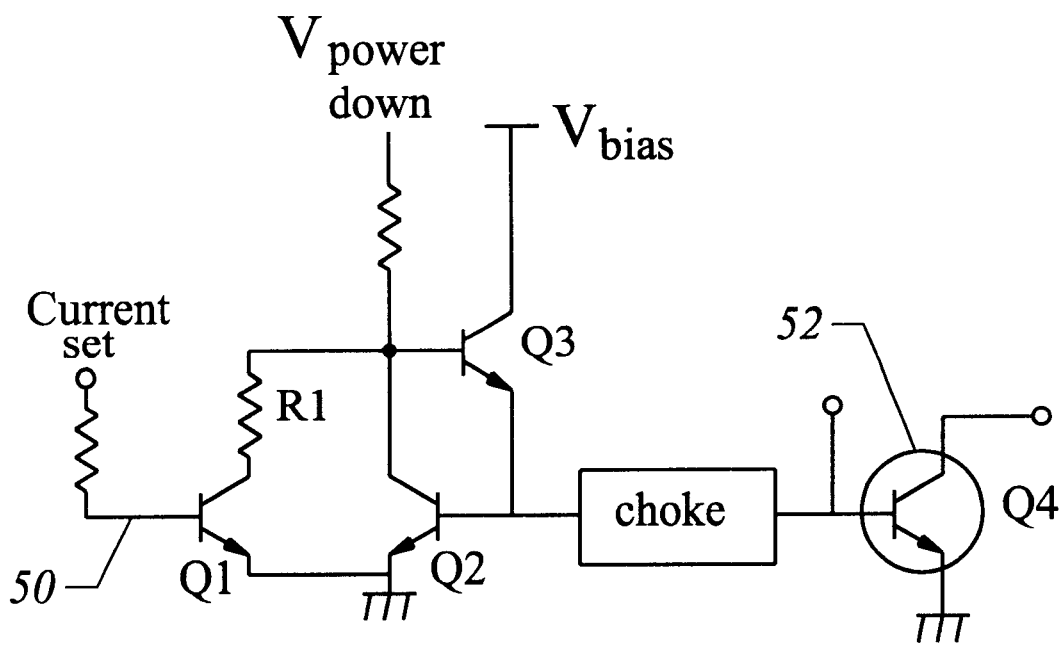
FIG. 9A is a schematic illustrating a bias circuit which can be used in the circuits of FIGS. 7 and 8.
Figure 9B:
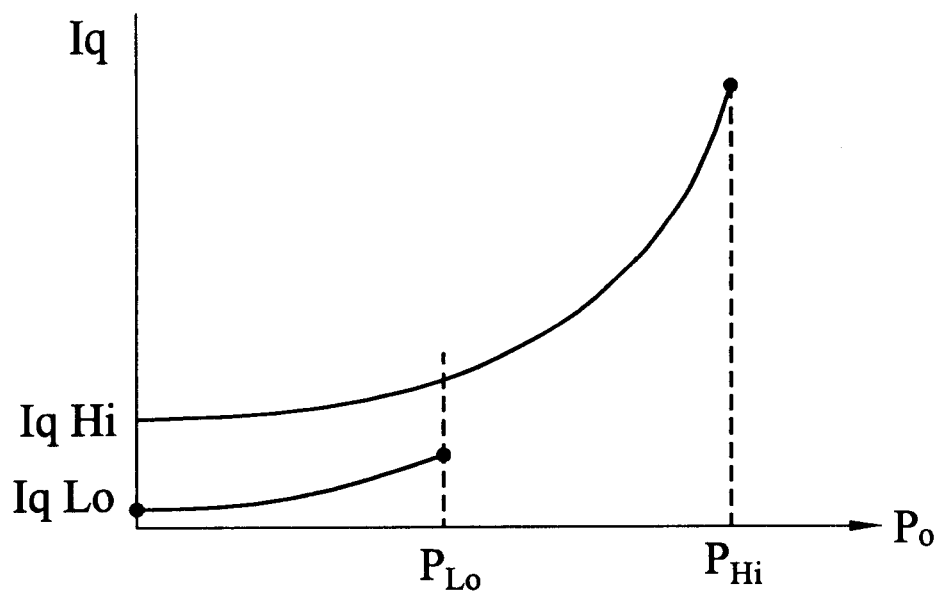
FIG. 9B is a plot of operating current verses power level illustrating quiescent current (high) and quiescent current (low) using the bias circuit of FIG. 9A.

In these illustrated embodiments, the amplifier operates in near Class B mode. For the low output power mode, the quiescent current can be reduced further. For example, the 28 dBm mode uses 70 to 100 ma quiescent current; whereas the 16 dBm mode will use only 10 to 20 ma quiescent current. This further reduces the dc power consumption below 16 dBm. The quiescent current adjustment can be easily implemented. In the embodiments of FIGS. 5 and 6, path 2 is set at low quiescent current, whereas in FIGS. 7 and 8, the bias circuit can be adjusted either by an external reference voltage, or alternatively as shown in FIG. 9A, a switch 50 (Q1) can be included to bypass some reference current from current mirror transistor Q2, which reduces the mirror current through amplifier transistor 52 (Q4). In this circuit, transistors Q2, Q3 and Q4 form a current source with the reference current flowing through resistor R2 and to transistor Q2. When the current set mode is high, transistor Q1 is turned on into saturation and diverts part of the reference current from Q2, resulting in a lower current at Q4. This is illustrated schematically in the plot of current versus power in FIG. 9B.

By changing the load impedance of an RF signal amplification unit, the efficiency of a power amplifier is increased at a back-off power level. While the invention has been described with reference to specific embodiments, the description is illustrative of the invention and is not to be construed as limiting the invention. Various modifications and applications may occur to those given the art without departing from the true spirit and scope of the invention as defined by the appended claims.

What is claimed is:

1. An RF power amplifier operable at two output power levels comprising:

a) a first signal power amplification unit having an input terminal for receiving an input signal, an output terminal for producing an amplified power output signal, and a power terminal for receiving a voltage, and b) a first load coupling the output terminal of the first signal power amplification unit to an RF output, the load having a plurality of values corresponding to a plurality of power levels including a first value for a full power output signal and a second value for a back-off power level, the second value being greater than the first value, the load value being greatest for the lowest power level, and c) a second signal power amplification unit in parallel with the first signal power amplification unit and a second load coupling the output terminal of the second signal power amplification unit to the RF output, the second load having higher impedance than the first load, and switch means for alternately connecting the first signal power amplification unit and the second signal power amplification unit to the RF output.

2. The RF power amplifier as defined by claim 1 wherein the first signal power amplification unit includes an output matching network for full power output.

3. The RF power amplifier as defined by claim 1 wherein the first power signal amplification unit includes an output matching network for full power operation and a switch for bypassing the output matching network for back-off power operation.

4. The RF power amplifier as defined by claim 1 wherein the load comprises an output matching network, the output matching network including a shunt inductance connected to a circuit ground through a switch, the switch being open for full power operation and the switch being closed with the inductor comprising load impedance to the power amplifier at back-off power operation.

5. The RF power amplifier as defined by claim 1 and further including a bias circuit for applying a bias voltage to the input terminal, the bias circuit comprising a current mirror in which a first reference current is applied through the current mirror for a full power operation and in which reduced bias and current is applied through the current mirror for a back-off power operation.

6. The RF power amplifier as defined by claim 4 wherein the current mirror includes a switch for bypassing reference current from the current mirror for back-off power operation.

7. The RF power amplifier as defined by claim 1 wherein each signal power amplification unit includes at least one transistor.

8. The RF power amplifier as defined by claim 7 wherein each transistor comprises a bipolar transistor, the input terminal comprising a base terminal and the output terminal comprising a collector terminal.

9. The RF power amplifier as defined by claim 7 wherein each signal amplification unit comprises a field effect transistor, the input terminal being a gate terminal, and the output terminal being a source terminal.

* * * * *